United States Patent
Tracy et al.

(10) Patent No.: US 9,754,857 B2
(45) Date of Patent: Sep. 5, 2017

(54) FOLDED FIN HEAT TRANSFER DEVICE

(75) Inventors: Mark S Tracy, Tomball, TX (US); Earl W Moore, Cypress, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1519 days.

(21) Appl. No.: 13/201,243

(22) PCT Filed: Mar. 23, 2009

(86) PCT No.: PCT/US2009/037944
§ 371 (c)(1),
(2), (4) Date: Aug. 12, 2011

(87) PCT Pub. No.: WO2010/110779
PCT Pub. Date: Sep. 30, 2010

(65) Prior Publication Data
US 2011/0290452 A1    Dec. 1, 2011

(51) Int. Cl.
*F28D 15/00* (2006.01)
*H01L 23/467* (2006.01)
*G06F 1/20* (2006.01)

(52) U.S. Cl.
CPC ............ *H01L 23/467* (2013.01); *G06F 1/20* (2013.01); *H01L 2924/0002* (2013.01)

(58) Field of Classification Search
CPC . H01L 23/467; H01L 2924/0002; G06F 1/20; F28D 15/00; F28D 15/02; F28D 15/0241; F28D 15/0275; F28D 15/04
USPC ........ 165/80.3, 104.26, 104.33, 104.34, 121; 361/679.47, 679.55
See application file for complete search history.

(56) References Cited

U.S. PATENT DOCUMENTS

| | | | |
|---|---|---|---|
| 6,262,893 B1* | 7/2001 | Liu | 361/704 |
| 6,362,958 B1* | 3/2002 | Yu et al. | 361/679.48 |
| 6,650,540 B2* | 11/2003 | Ishikawa | 361/695 |
| 2006/0098414 A1 | 5/2006 | Huang | |
| 2006/0256528 A1 | 11/2006 | Hwang et al. | |
| 2008/0105410 A1 | 5/2008 | Hwang et al. | |
| 2008/0135210 A1 | 6/2008 | Wang et al. | |
| 2009/0034196 A1 | 2/2009 | Wang et al. | |
| 2009/0046426 A1* | 2/2009 | Ishikawa | 361/695 |

(Continued)

OTHER PUBLICATIONS

Mark S. Tracy and Earl W. Moore, "Notification of Transmittal of the International Search Report and the Written Opinion of the International Searching Authority, or the Declaration," International Application No. PCT/US2009/037944 filed Mar. 23, 2009, dated Dec. 22, 2009, pp. 1-12.

*Primary Examiner* — Travis Ruby
(74) *Attorney, Agent, or Firm* — HP Patent Department

(57) ABSTRACT

A system for cooling a heat producing device is provided. The system can include an air mover (110) wherein at least a portion of the discharge airflow (115) is directed radially outward. The system can also include a thermal conduit (120) and a thermal member (130). The thermal member can have a first surface (135), a second surface (140) and at least one integrally formed heat exchange surface (150). At least a portion of the heat exchange surface (150) can be at least partially disposed in the air mover discharge airflow (115). At least a portion of the first surface (135) can be disposed proximate the thermal conduit (120). At least a portion of the second surface (140) can be disposed proximate the air mover (110).

20 Claims, 4 Drawing Sheets

(56) References Cited

U.S. PATENT DOCUMENTS

2009/0133855 A1* 5/2009 Hsieh et al. ............. 165/104.26
2009/0211737 A1* 8/2009 Wang et al. ............. 165/104.34

* cited by examiner

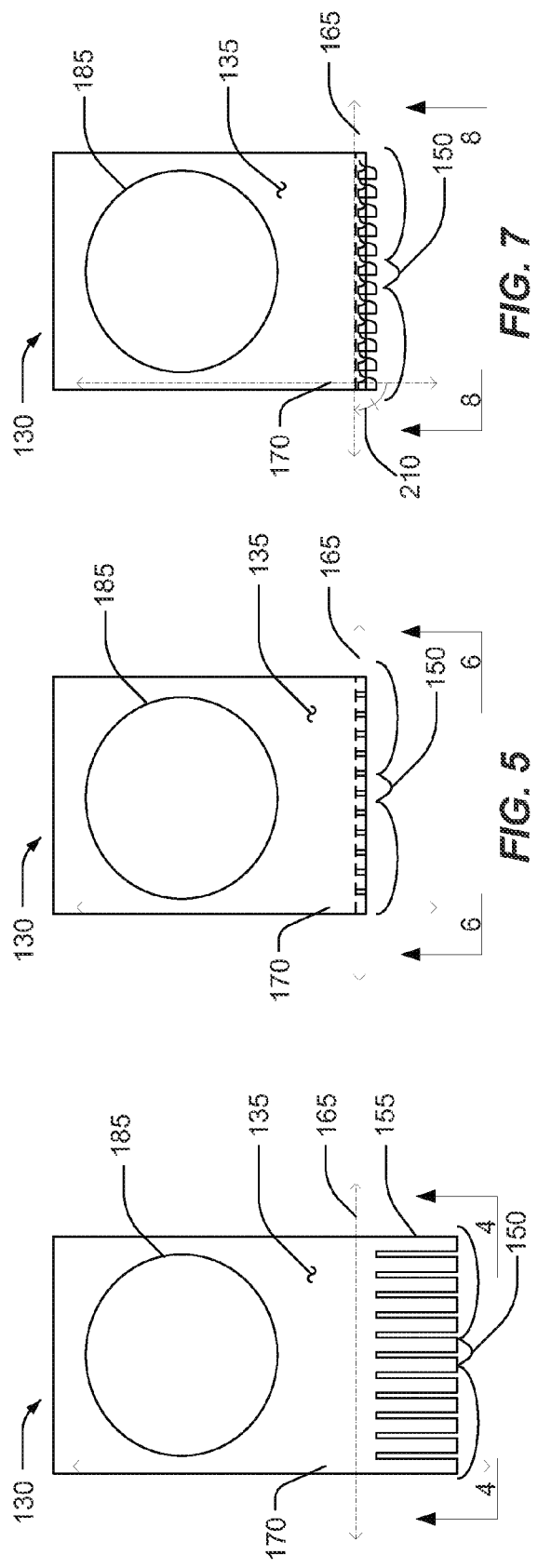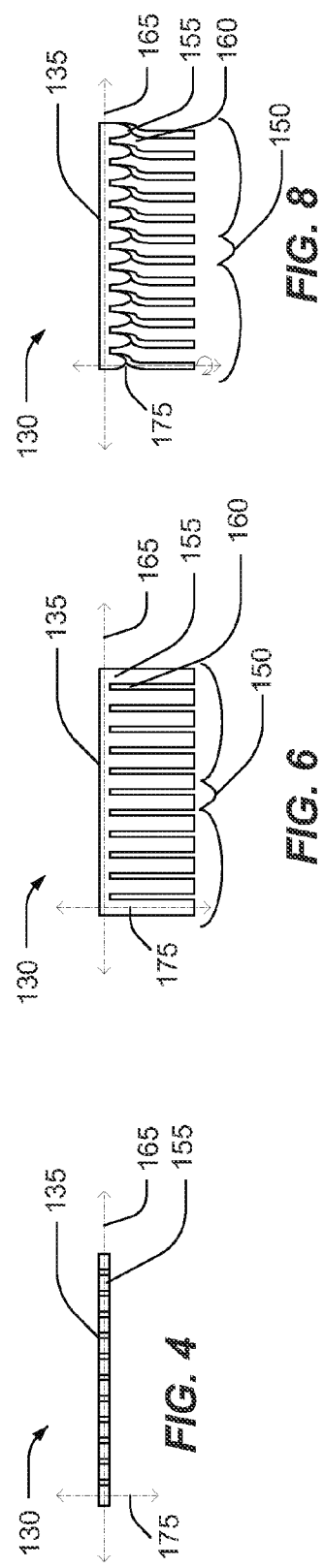

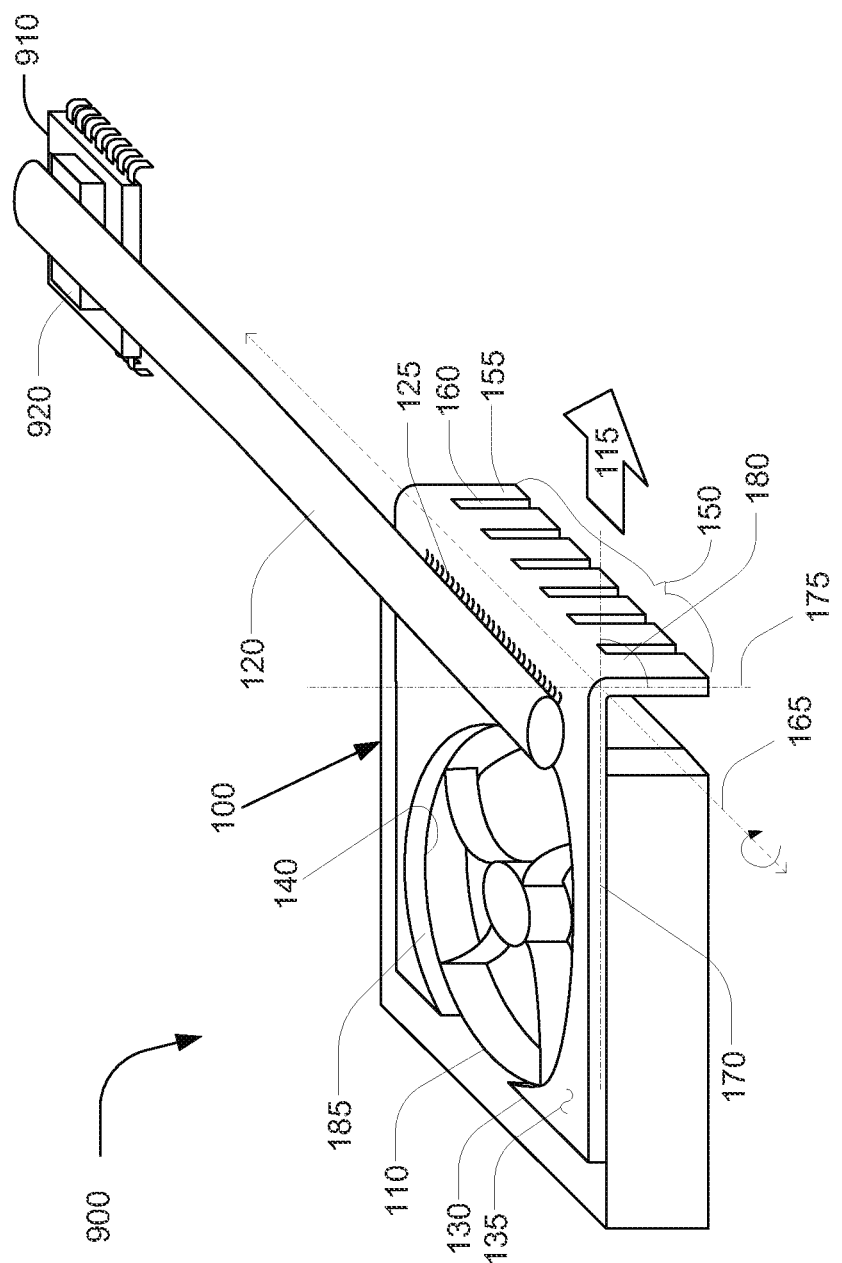

FOLDED FIN HEAT TRANSFER DEVICE

BACKGROUND OF THE INVENTION

Description of the Related Art

Heat dissipation in portable electronic devices is problematic at best due to the small footprint, limited space, and lack of power typically associated with such devices. A fan is often disposed within the electronic device to assist in the dissipation of heat generated by the electronic components disposed therein. The use of a fan for cooling has practical limitations however, as the airflow through the confines of the enclosure housing the electronic device is frequently limited and may bypass the actual heat generating components. To improve cooling performance, portable electronic devices frequently use a remote heat exchanger to cool various heat producing devices. The remote heat exchanger design consists of a fan, a thermal spreader or attachment plate, one or more heat pipes and an array of attached, separate, cooling fins at the fan discharge. The cooling fins are often individually attached to a base using solder or other thermal bonding techniques to create the final heat exchanger assembly. The attachment of multiple parts to provide the remote heat exchange surface is costly and labor intensive.

SUMMARY OF THE INVENTION

A system for cooling a heat producing device is provided. The system can include an air mover wherein at least a portion of the discharge airflow is directed radially outward. The system can also include a thermal conduit and a thermal member. The thermal member can have a first surface, a second surface and at least one integrally formed heat exchange surface. At least a portion of the heat exchange surface can be at least partially disposed in the air mover discharge airflow. At least a portion of the first surface can be disposed proximate the thermal conduit. At least a portion of the second surface can be disposed proximate the air mover.

A method for cooling a heat producing device is also provided. Heat can be conveyed from a heat producing device using a thermal conduit having a first end and a second end. At least a portion of the heat conveyed via the thermal conduit can be transferred to a thermal member comprising a thermally conductive member having a first surface, a second surface, at least one exterior edge, and at least one integral heat exchange surface. A portion of the first surface can be disposed proximate the thermal conduit. At least a portion of the discharge airflow from the air mover can be directed across at least a portion of the heat exchange surface. The heat exchange surface can comprise a plurality of parallel fins folded about a transverse axis of the thermal member. The folded parallel fins can form an angle of at least 60° as measured between the longitudinal axis of the thermal member and the longitudinal axis of each of the plurality of folded fins.

Another system for cooling a heat producing device is also provided. An air mover can be adapted to discharge at least a portion of the discharge airflow in a radial outward direction. The system can also include a thermal conduit and a planar thermal member having a first surface, a second surface, and at least one integral heat exchange surface. At least a portion of the heat exchange surface can be at least partially disposed in the air mover discharge airflow. At least a portion of the thermal member can provide at least a portion of the air mover housing. At least a portion of the first surface can be disposed proximate the thermal conduit. At least a portion of the heat exchange surface can comprise a plurality of parallel fins folded about an axis transverse to the plane of the thermal member. The folded parallel fins can form an angle of at least 30° as measured with respect to an axis perpendicular to the plane of the thermal member.

As used herein, the terms "connect" "connection," and "connected" refer to "in direct connection with" or "in connection with via another element or member."

As used herein, the terms "fold," "folding," and "folded," refer to bending or otherwise curving a single member about an intermediate axis through an arc of from about 1° to about 180°, where the intermediate axis is drawn through the member.

As used herein, the terms "thermally connect" or "thermally connected" refer to a direct connection between two or more primary components through which thermal energy can flow or to an indirect connection wherein thermal energy can flow between two or more primary components thermally linked by one or more intermediate components.

BRIEF DESCRIPTION OF THE DRAWINGS

Advantages of one or more disclosed embodiments may become apparent upon reading the following detailed description and upon reference to the drawings in which:

FIG. 3 is a plan view of an illustrative thermal member, according to one or more embodiments described herein;

FIG. 4 is an elevation view of the illustrative thermal member depicted in FIG. 3, according to one or more embodiments described herein;

FIG. 5 is a plan view of an illustrative thermal member depicted in FIG. 3 with the parallel fins folded through an arc of approximately 90° about a transverse axis of the thermal member, according to one or more embodiments described herein;

FIG. 6 is an elevation view of the illustrative thermal member depicted in FIG. 5, according to one or more embodiments described herein;

FIG. 7 is a plan view of an illustrative thermal member depicted in FIG. 5 with the folded fins rotated through an arc of approximately 90° about a longitudinal axis, according to one or more embodiments described herein;

FIG. 8 is an elevation view of the illustrative thermal member depicted in FIG. 7, according to one or more embodiments described herein; and FIG. 9 is an isometric view of an illustrative cooling system for a heat producing device, according to one or more embodiments described herein.

DETAILED DESCRIPTION

Figure 1:
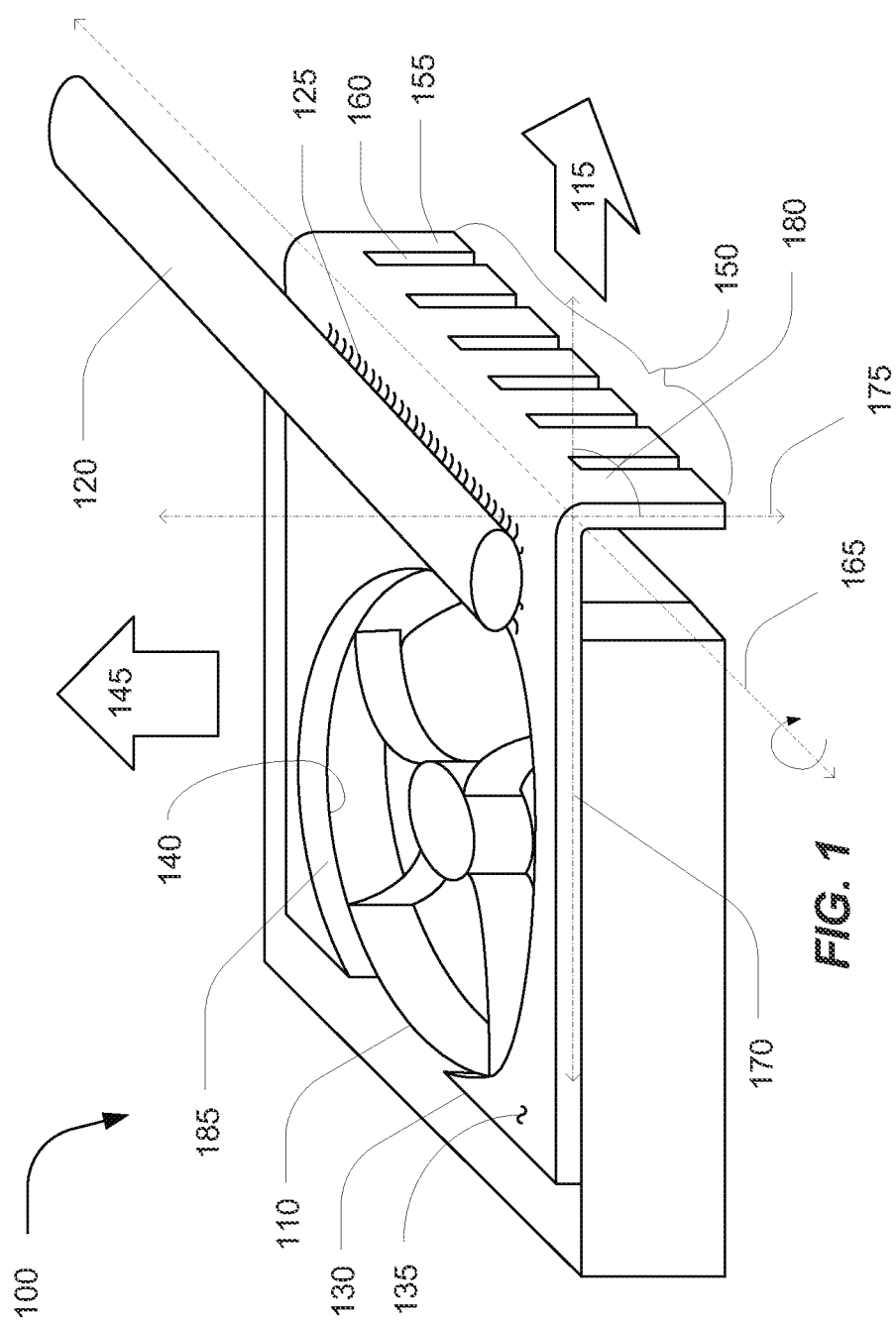
FIG. 1 is an isometric view of an illustrative cooling system, according to one or more embodiments described herein.

FIG. 1 is an isometric view of an illustrative cooling system 100, according to one or more embodiments. In one or more embodiments, the cooling system 100 can include an air mover 110, a thermal conduit 120, and a thermal member 130. In one or more embodiments, the thermal member 130 can include a first surface 135, a second surface 140, and an integral heat exchange surface 150. In one or more embodiments, the heat exchange surface 150 can include, but is not limited to, a plurality of parallel fins 155 and one or more voids 160.

In one or more embodiments, the air mover 110 can include, but is not limited to, one or more axial flow fans, one or more squirrel cage fans, one or more mixed-flow fans, one or more cross-flow fans, one or more flat blower fans, or the like. In one or more embodiments, the air mover 110 can include a standard, i.e. three pin/three wire, cooling fan, or a pulse wave modulated ("PWM"), i.e. four pin/four wire, cooling fan. In one or more embodiments, the air mover 110 can have a diameter of from about 2.5 cm (1 inch) to about 20 cm (8 inches); about 3.8 cm (1.5 inches) to about 15 cm (6 inches); or about 5 cm (2 inches) to about 12.5 cm (5 inches). In one or more embodiments, the operating voltage of the air mover 110 can be an alternating current ("AC") voltage or a direct current ("DC") voltage. In one or more specific embodiments, the operating voltage of the air mover 110 can range from about −12 VDC to about +12 VDC, or from about −5 VDC to about +5 VDC.

In one or more embodiments, all or a portion of the discharge airflow from the air mover 110 can be directed axially 145, i.e. along the rotational axis of the air mover 110. In one or more embodiments, all or a portion of the discharge airflow can be directed radially outward 115 from the air mover 110. In one or more embodiments, a first portion of the discharge air from the air mover 110 can be directed radially outward 115, with the remaining portion of the discharge airflow directed axially 145.

The rotational speed of the air mover 110 can be fixed or variable. In one or more embodiments, the rotational speed of the air mover 110 can be adjusted based upon one or more measured parameters, including but not limited to, temperature, heat load, or the like. In one or more embodiments, the rotational speed of the air mover 110 can be manually adjusted. In one or more embodiments, the air mover 110 can have a rotational speed of from about 100 revolutions per minute ("RPM") to about 50,000 RPM; from about 500 RPM to about 30,000 RPM; or from about 1,000 RPM to about 25,000 RPM.

The air mover 110 can be disposed on the same plane as the thermal member 130 or on a plane offset from the plane of the thermal member 130. In one or more embodiments, the air mover 110 can be disposed on a plane partially or completely offset from the plane of the thermal member 130, such that all or a portion of the axial discharge airflow 145 can flow over, across, impact, or otherwise impinge all or a portion of the thermal member 130. In one or more specific embodiments, the air mover 110 can be disposed on a plane partially or completely offset from the plane of the thermal member 130, such that all or a portion of the radial discharge airflow 115 can impact or otherwise impinge all or a portion of the thermal member 130.

In one or more specific embodiments, the air mover 110 can be disposed such that all or a portion of the axial discharge airflow 145 can flow across, over, impact, or otherwise impinge all or a portion of the thermal member 130. In one or more specific embodiments, the air mover 110 can be disposed such that all or a portion of the radial discharge airflow 115 can flow over, across, impact, or otherwise impinge all or a portion of the heat exchange surface 150.

In one or more embodiments, the air mover 110 can be permanently or detachably attached to all or a portion of the thermal member 130. In one or more embodiments, the air mover 110 can be independent device, having no mechanical or physical attachment or connection to the thermal member 130.

The thermal conduit 120 can be any thermally conductive member suitable for transmitting or otherwise conveying all or a portion of the thermal energy introduced to the thermal conduit 120 from a first location to a second location. In one or more specific embodiments, the thermal conduit 120 can include, but is not limited to, one or more solid thermally conductive members, one or more partially solid, or hollow, thermally conductive members, one or more vapor chambers, or any combination thereof.

In one or more embodiments, the thermal conduit 120 can be a hollow member having any cross-section bounded by a wall forming an interior and an exterior surface. The thermal conduit 120 can have a first end and a second end. The thermal conduit 120 can have any physical size, shape, or configuration. In one or more embodiments, the thermal conduit 120 can have any closed cross-section, for example circular, oval, an elliptical, or the like. In one or more embodiments, the thermal conduit 120 can be a single-piece hollow member, for example a pipe or similar tubing. In one or more embodiments, the thermal conduit 120 can be a multi-piece hollow member having, for example, a top section and a bottom section joined peripherally about an inner and an outer circumference. In one or more embodiments, the thermal conduit 120 can be a solid member having high thermal conductivity and any cross-sectional shape, geometry or configuration.

The thermal conduit 120 can be of any length, shape, or configuration. In one or more embodiments, the thermal conduit 120 can have a length of about 2.5 cm (about 1 inch) or more; about 5 cm (about 2 inches) or more; about 10 cm (about 4 inches) or more; about 20 cm (about 8 inches) or more; or about 25 cm (about 12 inches) or more. In one or more embodiments, the thermal conduit 120 can be fabricated using any metal alloy or metal containing compound, for example an aluminous, i.e., an aluminum containing, alloy; a cuprous, i.e., a copper containing, alloy; or a nickel-coated cuprous alloy. In one or more embodiments, the thermal conduit 120 can be fabricated using non-metallic material having a high thermal conductivity, for example carbon fiber, carbon nanotubes, or the like. In one or more embodiments, the thermal conduit 120 can have a thermal conductivity of from about 1,000 W/m° C. to about 500,000 W/m° C.; from about 10,000 W/m° C. to about 250,000 W/m° C.; or from about 20,000 W/m° C. to about 200,000 W/m° C.

Although not depicted in FIG. 1, in one or more embodiments, one or more heat transfer enhancement devices can be disposed partially or completely about the thermal conduit 120. The one or more heat transfer enhancement devices can be disposed evenly or unevenly in, on, or about the exterior surface of the thermal conduit 120. In one or more embodiments, the one or more heat transfer enhancement devices can be integral with the thermal conduit 120, for example, one or more flutes, corrugations or integral fins can be disposed about the exterior surface of the thermal conduit 120. In one or more embodiments, the one or more heat transfer enhancement devices can be distinct from the thermal conduit 120, temporarily or permanently attached or otherwise thermally bonded to the thermal conduit 120.

In one or more embodiments, the one or more heat transfer enhancement devices can include, but are not limited to one or more fins or similar structures projecting from the surface of the thermal conduit 120. In one or more specific embodiments, the one or more heat transfer enhancement devices can include a plurality of parallel fins disposed axially along all or a portion of the thermal conduit 120. In one or more embodiments, the plurality of parallel fins can partially or completely encircle the thermal conduit 120. In one or more embodiments, the one or more heat transfer enhancement devices can include, one or more external projections integral with the thermal conduit 120, for example one or more ridges, flute, or similar surface structures disposed in, on, or about the thermal conduit 120.

In one or more embodiments, the thermal conduit 120 can be physically, mechanically, or thermally connected at the first end to the thermal member 130. In one or more embodiments, the thermal conduit 120 can be detachably attached, for example through the use of one or more releasable clips, with the thermal member 130. In one or more embodiments, the thermal conduit 120 can be permanently attached to the first thermal member 130, for example by soldering, welding, brazing, or the like. In one or more specific embodiments, heat transfer from the thermal conduit 120 to the thermal member 130 can be enhanced or otherwise facilitated by disposing a thermally conductive material 125 between the thermal conduit 120 and the thermal member 130. In one or more embodiments, the thermally conductive material 125 can include, but is not limited to heat transfer mastic, solder, thermally conductive bonding strips, or the like.

The thermal member 130 can be any thermally conductive member suitable for transmitting or otherwise conveying all or a portion of the thermal energy introduced from or transmitted by the thermal conduit 120. In one or more embodiments, the thermal member 130 can include, but is not limited to, one or more solid thermally conductive members, one or more partially solid, or hollow, thermally conductive members, one or more vapor chambers, or any combination thereof. In one or more specific embodiments, the thermal member 130 can be planar member having a first surface 135, a second surface 140, and a heat exchange surface 150. In one or more embodiments, the heat exchange surface 150 can have one or more exterior edges. In one or more embodiments, at least one of the exterior edges can include a plurality of parallel fins 155 alternating with one or more voids 160, thereby forming a heat exchange surface 150.

In one or more embodiments, all or a portion of the thermal member 130 can form all or a portion of the housing for the air mover 110. For example, in one or more embodiments, the thermal member 130 can form one or more end caps disposed at least partially within the axial discharge airflow 145 of the air mover 110. In one or more embodiments, the thermal member 130 can form one or more walls disposed at least partially within radial discharge airflow 115 of the air mover 110. In one or more specific embodiments, all or a portion of the thermal member 130 can form one or more end caps disposed at least partially within the axial discharge airflow 145 of the air mover 110 while the remaining portion of the thermal member 130 can form one or more walls disposed at least partially within the radial discharge airflow 115 of the air mover 110.

In one or more specific embodiments, all or a portion of the axial discharge airflow 145 from the air mover can flow across, under, over, or about all or a portion of the thermal member 130. In one or more specific embodiments, all or a portion of the radial discharge airflow 115 from the air mover 110 can flow across, under, over, or about all or a portion of the thermal member 130. In one or more embodiments, as depicted in FIG. 1, all or a portion of the axial discharge airflow 145 can flow through, across, under, over, or about one or more apertures 185 disposed in, on, or about the thermal member 130. In one or more specific embodiments, as depicted in FIG. 1, all or a portion of the radial discharge airflow 115 can flow across, under, over, or about all or a portion of the heat exchange surface 150.

In one or more embodiments, the thermal member 130 can be fabricated using any metal alloy or metal containing compound, for example an aluminous alloy; a cuprous alloy; or a nickel-coated cuprous alloy. In one or more embodiments, the thermal member 130 can be fabricated using non-metallic material having a high thermal conductivity, for example carbon fiber, carbon nanotubes, or the like. In one or more embodiments, the thermal member 130 can have a thickness of from about 0.1 mm to about 2 mm; about 0.2 mm to about 1.5 mm; or about 0.3 mm to about 1 mm. In one or more embodiments, the thermal member 130 can have a thermal conductivity of from about 1,000 W/m° C. to about 500,000 W/m° C.; from about 10,000 W/m° C. to about 250,000 W/m° C.; or from about 20,000 W/m° C. to about 200,000 W/m° C.

In one or more embodiments, the heat exchange surface 150 can be integral, cast, or fabricated as a single unit with the thermal member 130, i.e., as a unitary component of the thermal member 130. In one or more embodiments, the thermal member 130 can be a member having any size, shape or geometry suitable for disposal proximate the air mover 110, for example a cylindrical or hemispherical thermal member 130 can be used in lieu of a planar thermal member 130 dependent upon the physical characteristics of the air mover 110. In one or more specific embodiments, the thermal member 130 can be a planar member disposed about a laptop box fan serving as the air mover 110.

In one or more embodiments, the heat exchange area 150 of the thermal member 130 can include a portion along an exterior edge of the thermal member 130 suitably modified to provide the heat exchange area 150. In one or more embodiments, the heat exchange area 150 can be provided by disposing at regular or irregular intervals one or more voids 160 along at least a portion of the exterior edge to provide a plurality of fins 155. In one or more specific embodiments, as depicted in FIG. 1, the heat exchange area 150 can be provided by disposing at regular intervals one or more parallel voids 160 along at least a portion of the exterior edge to provide a plurality of parallel fins 155.

In one or more embodiments, the plurality of parallel fins 155 can form a comb-like structure disposed along the exterior edge of the thermal member 130. In one or more embodiments, all or a portion of the fins forming the plurality of parallel fins 155 can be folded about a first axis. In one or more specific embodiments, the first axis can be a transverse axis 165 of the thermal member 130 as depicted in FIG. 1. In one or more embodiments, each of the parallel fins 155 can be folded about a transverse axis 165 of the thermal member 130 through an arc 180 of about 15° or more; about 30° or more; about 45° or more; or about 60° or more. In one or more embodiments, folding all or a portion of the parallel fins 155 can form a rake-like structure disposed along the exterior edge of the thermal member 130. In one or more embodiments, in this configuration the radial discharge airflow 115 can be normal, i.e., at an angle of about 90°, or near-normal, i.e., at an angle of from about 45° to about 90°, to the fins 155 forming all or a portion of the heat exchange surface 150.

Figure 2:
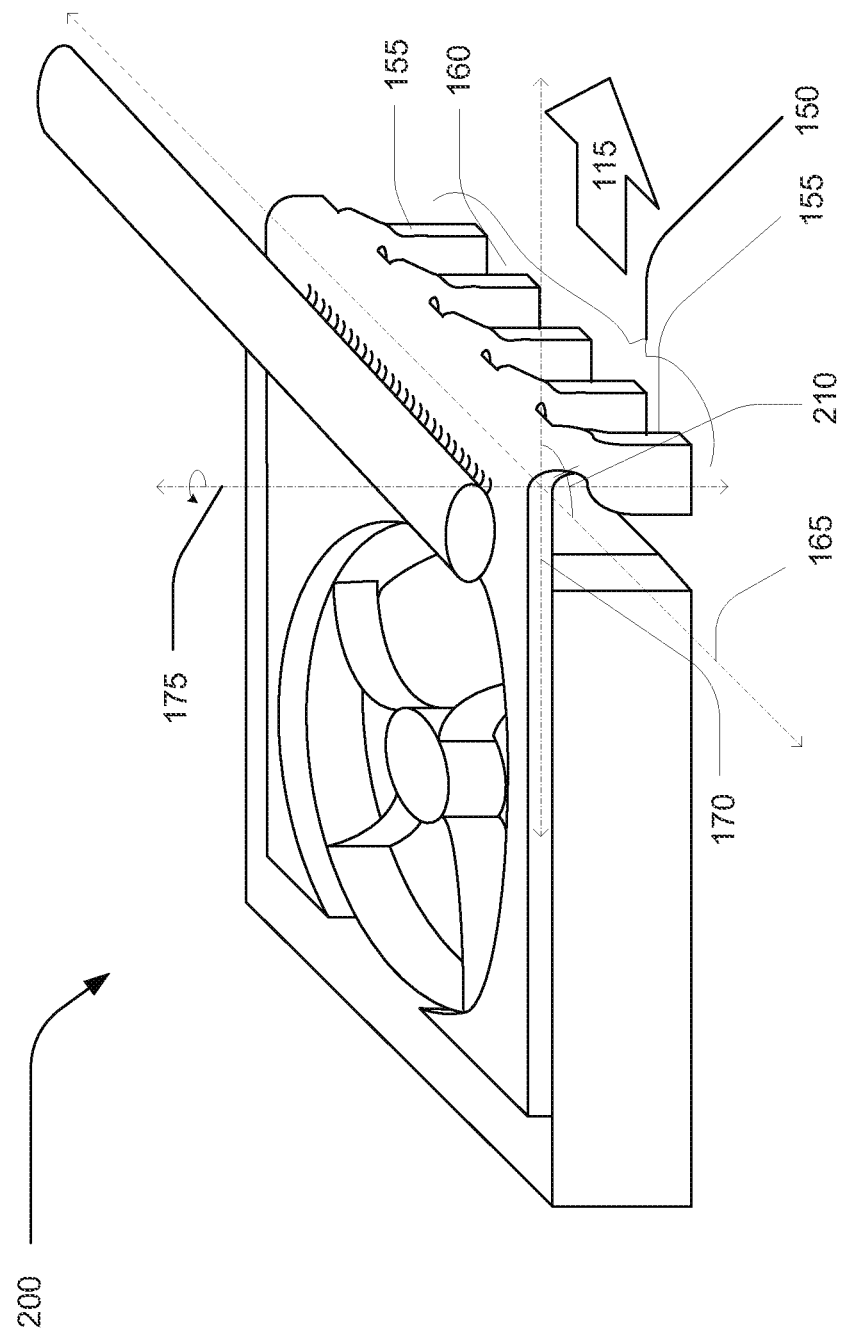
FIG. 2 is an isometric view of another illustrative cooling system, according to one or more embodiments described herein.

FIG. 2 is an isometric view of another illustrative cooling system 200, according to one or more embodiments. In one or more embodiments, all or a portion of the folded fins 155 can be further rotated about a second axis. In one or more specific embodiments, the second axis of rotation can be a longitudinal axis 175 of each folded fin 155. In one or more embodiments, all or a portion of the folded fins 155 can be rotated about its longitudinal axis 175 through an arc 210 of about 15° or more; about 30° or more; about 45° or more; or about 60° or more. In one or more specific embodiments, in this configuration the radial discharge airflow 115 can be tangential or near tangential to the fins 155 forming all or a portion of the heat exchange surface 150.

FIG. 3 is a plan view of an illustrative thermal member 130, according to one or more embodiments. FIG. 4 is an elevation view of the illustrative thermal member 130 depicted in FIG. 3, according to one or more embodiments. In one or more embodiments, the thermal member 130 can be a planar member. In one or more embodiments, one or more voids 160 can be disposed evenly or unevenly about one or more exterior edges of the thermal member 130. In one or more specific embodiments, the one or more voids 160 can be parallel and disposed evenly along one or more exterior edges of the thermal member 130 to provide a plurality of parallel fins 155 disposed along the exterior edge of the thermal member 130. In one or more embodiments, the alternating series of fins 155 and voids 160 can provide all or a portion of the heat exchange surface 150.

FIG. 5 is a plan view of an illustrative thermal member 130 depicted in FIG. 3 with the parallel fins 155 folded through an arc 180 of approximately 90° about a transverse axis 165 of the thermal member 130, according to one or more embodiments. FIG. 6 is an elevation view of the illustrative thermal member 130 depicted in FIG. 5, according to one or more embodiments. In one or more embodiments, the fins 155 can be folded through an arc 180 about a transverse axis 165 of the thermal member 130. FIGS. 5 and 6 depict an exemplary thermal member 130 having the parallel fins 155 folded through an arc 180 of approximately 90° about the transverse axis 165 of the thermal member 130. FIGS. 5 and 6 depict the rake-like shape formed by folding the fins 155 through an arc of approximately 90° about the transverse axis 165 of the thermal member 130.

In this configuration, the radial discharge airflow from the air mover 110 can impact or otherwise impinge the fins 155 at a normal, i.e. at or about 90°, or near-normal, i.e. between 45° and 90°, angle. The relatively high angle of incidence of the radial discharge airflow on the folded fins 155 can increase pressure drop and decrease the discharge airflow across the folded fins 155.

FIG. 7 is a plan view of an illustrative thermal member 130 depicted in FIG. 5 with the folded fins 155 rotated through an arc 210 of approximately 90° about a longitudinal axis 175, according to one or more embodiments. FIG. 8 is an elevation view of the illustrative thermal member 130 depicted in FIG. 7 more clearly depicting the longitudinal axis 175, according to one or more embodiments. In one or more embodiments, the fins 155 can be rotated through an arc 210 about a longitudinal axis 175 of each respective folded fin 155. FIGS. 7 and 8 depict an exemplary thermal member 130 having the folded fins 155 rotated through an arc of approximately 90° about a longitudinal axis 175 of each respective tab 155.

In this configuration, the radial discharge airflow 115 from the air mover 110 will impact or otherwise impinge the fins 155 at a tangent, i.e. at an angle of about 0°, or near-tangent, i.e. at an angle of 0° to about 45°. The relatively low angle of incidence of the radial discharge airflow on the fins 155 can decrease discharge airflow pressure drop across the fins 155.

FIG. 9 is an isometric view of an illustrative cooling system 900 for a heat producing device 910, according to one or more embodiments. In one or more embodiments, a heat producing device 910 can be disposed proximate the second end of the thermal conduit 120. In one or more specific embodiments, one or more thermal links 920 can be used to thermally connect the heat producing device 910 and the thermal conduit 120.

In one or more embodiments, the heat producing device 910 can be any electronic component that, when in operation, increases in temperature and/or thermal output. In one or more embodiments, the heat producing device 910 can include, but is not limited to, a power supply, a voltage regulator, an integrated circuit, a solid state drive ("SSD"), a rotating magnetic hard disk drive ("HDD"), a central processing unit ("CPU"), a graphical processing unit ("GPU"), or the like. In one or more embodiments, the heat producing device 910 can be a surface or socket mount integrated circuit suitable for use in a computing device, for example, portable computers, desktop computers, workstations, handheld electronic devices such as personal digital assistants ("PDAs"), cellular devices, and the like.

In one or more embodiments, the heat producing device 910 can have an operating temperature of about 25° C. or more; about 50° C. or more; about 75° C. or more; or about 100° C. or more. In one or more embodiments, the heat producing device 230 can have a power consumption of about 10 W or more; about 25 W or more; about 50 W or more; or about 100 W or more.

In one or more embodiments, the thermal link 920 can be disposed at any location along, on, or about the thermal conduit 120. In one or more embodiments, the thermal link 920 can provide a thermally conductive pathway from the one or more heat producing devices 910 to the thermal member 230. In one or more embodiments, the thermal link 920 can have any size, shape, geometry or physical orientation. In one or more embodiments, the thermal link 920 can include one or more pickups for the heat producing devices 910.

The thermal ink 920 can be single-piece or multi-piece. In one or more embodiments, the thermal link 920 can be disposed proximate the heat producing device 910. In one or more embodiments, thermal link 920 can be thermally connected or otherwise temporarily or permanently bonded to the heat producing device 910 using a thermal mastic or similar material. In one or more embodiments, the thermal link 920 can be thermally connected to the heat producing device 910 by disposing all or a portion of the thermal link 920 in direct contact with all or all or a portion of the heat producing device 910.

The thermal link 920 can be fabricated using any thermally conductive material. In one or more embodiments, the thermal link 920 can be fabricated from aluminum, an aluminous alloy, copper, or a cuprous alloy. In one or more embodiments, the thermal link 920 can be fabricated using carbon nanotubes having a greater in-plane thermal conductivity than out-of-plane thermal conductivity. In one or more embodiments, the thermal link 920 can have a thermal conductivity of from about 10 W/m° C. to about 10,000 W/m° C.; from about 25 W/m° C. to about 5,000 W/m° C.; or from about 50 W/m° C. to about 2,500 W/m° C.

Certain embodiments and features have been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

Various terms have been defined above. To the extent a term used in a claim is not defined above, it should be given the broadest definition persons in the pertinent art have given that term as reflected in at least one printed publication or issued patent. Furthermore, all patents, test procedures, and other documents cited in this application are fully incorporated by reference to the extent such disclosure is not inconsistent with this application and for all jurisdictions in which such incorporation is permitted.

While the foregoing is directed to embodiments of the present invention, other and further embodiments of the invention may be devised without departing from the basic scope thereof, and the scope thereof is determined by the claims that follow.

What is claimed is:

1. A heat exchange system comprising:
   an air mover wherein at least a portion of the air mover discharge airflow is directed radially outward;
   a thermal conduit;
   a thermal member having a first surface, a second surface and at least one integrally formed heat exchange surface integrally formed as a single unitary body with the first surface and the second surface;
   wherein at least a portion of the heat exchange surface is at least partially disposed in the air mover discharge airflow;
   wherein at least a portion of the first surface is disposed proximate the thermal conduit; and
   wherein at least a portion of the second surface is disposed proximate the air mover.

2. The system of claim 1, wherein at least a portion of the thermal conduit is at least partially bonded to at least a portion of the thermal member using a thermally conductive medium.

3. The system of claim 2, wherein the thermally conductive medium is selected from the group of media consisting of: a heat transfer mastic, solder, and thermally conductive bonding strips.

4. The system of claim 1, wherein the thermal conduit is selected from the group of conduits consisting of: a solid metallic member, a hollow heat pipe and a hollow vapor chamber having a wick at least partially disposed therein.

5. The system of claim 1, wherein the thermal conduit comprises a conduit having at least a first end and a second end;
   wherein at least a portion of the first end is disposed proximate a heat producing device selected from the group of devices consisting of: a computing device central processing unit (CPU), computing device graphical processing unit (GPU), a solid state drive (SSD), a hard disk drive (HDD), computing device read only memory (ROM), computing device random access memory (RAM); and
   wherein at least a portion of the second end is disposed proximate the thermal member.

6. The system of claim 1, wherein the thermal member comprises a planar member having at least one exterior edge; and
   wherein the at least one integral heat exchange surface comprises:
      cutting a plurality of parallel voids along at least a portion of the one exterior edge to provide a plurality of parallel fins; and
      folding at least a portion of the parallel fins about a transverse axis of the thermal member to that through an arc of at least 60° as measured between a longitudinal axis of the thermal member and a longitudinal axis of each of the rotated parallel fins.

7. The system of claim 6, further comprising independently rotating at least a portion of each of the plurality of parallel fins through an arc of at least 30° about the longitudinal axis of each of the fins.

8. The system of claim 1, wherein the thermal member comprises a single plate providing the first surface, the second surface and the heat exchange surface, the single plate comprising a first aperture therethrough to direct axial airflow from the air mover and second apertures therethrough to direct radial airflow from the air mover.

9. The system of claim 8, wherein the single plate comprises a planar portion comprising the first aperture and a folded edge portion comprising the second apertures, wherein the thermal conduit is at least partially bonded to the planar portion between the folded edge portion and the first aperture.

10. The system of claim 9, wherein the planar portion extends in a plane, wherein the folded edge portion extends on a first side of the plane and wherein the thermal conduit is at least partially bonded to the planar portion on a second side of the plane.

11. The system of claim 1, wherein the thermal member comprises a single plate providing the first surface, the second surface and the heat exchange surface, the single plate supported adjacent the air mover and folded so as to be impacted by both axial discharge airflow and radial discharge airflow from the air mover.

12. The system of claim 1, wherein the thermal member comprises:
    a folded edge portion comprising a wall comprising:
    a face forming the exchange surface, the face having a surface area and extending perpendicular to and across a radial discharge direction of airflow from the air mover; and
    apertures through the wall, wherein a majority of the surface area of the face is imperforate.

13. A method for cooling a heat producing device (910), comprising:
    conveying heat from the heat producing device via a thermal conduit having a first end and a second end;
    transferring at least a portion of the conveyed heat from the thermal conduit to a thermal member comprising a metallic member having a first surface, a second surface, at least one exterior edge, and at least one integral heat exchange surface integrally formed as part of a single unitary body with the first surface and the second surface;
       wherein at least a portion of the first surface is disposed proximate the thermal conduit; and
    directing at least a portion of an air mover radial discharge airflow across at least a portion of the heat exchange surface;
       wherein at least a portion of the heat exchange surface is disposed in the air mover radial discharge airflow; and
       wherein the heat exchange surface comprises a plurality of parallel fins folded about a transverse axis of the thermal member, the fins having minor dimension edges and major dimension faces, the faces extending in a single plane perpendicular to air mover discharge airflow; and wherein the folded parallel fins form an arc of at least 60° as measured between a longitudinal axis of the thermal member and a longitudinal axis of each of the plurality of folded parallel fins.

14. The method of claim 13, wherein the thermal conduit is selected from the group of conduits consisting of: a heat pipe and a vapor chamber.

15. The method of claim 13, further comprising independently rotating at least a portion of each of the parallel fins by at least 30° about an axis perpendicular to a plane of the thermal member.

16. A system comprising:
an air mover adapted to discharge at least a portion of the discharge airflow in a radial outward direction;
a thermal conduit;
a planar thermal member having a first surface, a second surface and at least one integral heat exchange surface integrally formed as part of a single unitary body with the first surface and the second surface;
   wherein at least a portion of the at least one integral heat exchange surface is at least partially disposed in the air mover discharge airflow;
   wherein at least a portion of the thermal member forms at least a portion of a housing about the air mover; and
   wherein at least a portion of the first surface is disposed proximate the thermal conduit;
   wherein the heat exchange surface comprises a plurality of parallel fins folded at an angle of at least 30° measured with respect to an axis perpendicular to a plane of the thermal member.

17. The system of claim 16, wherein at least a portion of the thermal conduit is at least partially bonded to at least a portion of the thermal member using a thermally conductive medium selected from the group of heat transfer media consisting of: a heat transfer mastic, solder, and thermally conductive bonding strips.

18. The system of claim 16, wherein the thermal conduit is selected from the group of conduits consisting of: a solid metallic member, a hollow heat pipe, and a hollow vapor chamber having a wick at least partially disposed therein.

19. The system of claim 16, wherein the thermal conduit comprises a conduit having at least a first end and a second end;
   wherein at least a portion of the first end is disposed proximate a heat producing device selected from the group of devices consisting of: a computing device central processing unit (CPU), computing device graphical processing unit (GPU), a solid state drive (SSD), a hard disk drive (HDD), computing device read only memory (ROM), computing device random access memory (RAM); and
   wherein at least a portion of the second end is disposed proximate the first surface (135) of the thermal member (130).

20. The system of claim 19, further comprising independently rotating at least a portion of each of the parallel fins by at least 30° about an axis perpendicular to the thermal member.

* * * * *